(12) United States Patent
Yang et al.

(10) Patent No.: US 7,145,490 B2
(45) Date of Patent: Dec. 5, 2006

(54) AUTOMATIC GAIN CONTROL SYSTEM AND METHOD

(75) Inventors: Chunhua Yang, Newbury (GB); Theng Tee Yeo, Singapore (SG); Masayuki Tomisawa, Singapore (SG)

(73) Assignee: Oki Techno Centre (Singapore) Pte Ltd, Singapore (SG)

( * ) Notice: Subject to any disclaimer, the term of this patent is extended or adjusted under 35 U.S.C. 154(b) by 0 days.

(21) Appl. No.: 11/183,385

(22) Filed: Jul. 18, 2005

(65) Prior Publication Data

US 2006/0071841 A1    Apr. 6, 2006

(30) Foreign Application Priority Data

Sep. 15, 2004    (SG) .............................. 200405081-1

(51) Int. Cl.
*H03M 1/00*    (2006.01)
(52) U.S. Cl. ........................ 341/139; 341/122
(58) Field of Classification Search .............. 341/139, 341/155, 144, 122–162
See application file for complete search history.

(56) References Cited

U.S. PATENT DOCUMENTS

| | | | | |
|---|---|---|---|---|
| 5,422,601 A | | 6/1995 | Kovacs et al. .............. 330/279 |
| 6,255,968 B1 * | | 7/2001 | Kitagawa ..................... 341/87 |
| 6,686,957 B1 * | | 2/2004 | Johnson et al. .............. 341/139 |
| 6,687,642 B1 * | | 2/2004 | Maher et al. ................. 702/127 |
| 6,882,835 B1 * | | 4/2005 | Oka et al. ..................... 331/176 |
| 6,999,737 B1 * | | 2/2006 | Ishihara ....................... 455/126 |

FOREIGN PATENT DOCUMENTS

| GB | 2 307 806 A | 6/1997 |
|---|---|---|
| GB | 2 355 607 A | 4/2001 |

OTHER PUBLICATIONS

Search Report from Australian Patent Office PCT/SG2004/05081-1 dated Jan. 12, 2006.

* cited by examiner

*Primary Examiner*—Lam T. Mai
(74) *Attorney, Agent, or Firm*—Ostrolenk, Faber, Gerb & Soffen, LLP

(57) ABSTRACT

An automatic gain control system comprises a number of variable gain stages connected in series and a number of sensors, the input of each sensor being connected to a respective output of the variable gain stages. The input of an analogue-to-digital converter is connected to the output of one of the variable gain stages. The input of a control unit is connected to the outputs of the sensors and to the output of the analogue-to-digital converter. The input of a digital-to-analogue converter is connected to the output of the control unit, and the control inputs of each of the variable gain stages is connected to an output of the digital-to-analogue converter. The outputs of the digital-to-analogue converter are used to control the gains of the variable gain stages. Also disclosed is a method for automatically controlling gain in a receiver system.

18 Claims, 3 Drawing Sheets

Block diagram of preferred automatic gain control system

Fig.1 Block diagram of preferred automatic gain control system

AUTOMATIC GAIN CONTROL SYSTEM AND METHOD

REFERENCE TO RELATED APPLICATION

This application claims the benefit of the filing date of Singapore Patent Application No. SG200405081-1 filed 15 Sep. 2004, the disclosure of which is hereby incorporated by reference.

FIELD OF THE INVENTION

The present invention relates to an automatic gain control system and a method for automatically controlling gain, for example in a receiver system.

BACKGROUND OF THE INVENTION

Automatic gain control (AGC) is an essential element in modern communication receivers enabling the estimation of signal strength and the automatic adjustment of the amplification gain in order to maintain a relatively constant signal level. In typical conventional systems, such as in burst-mode wireless communication systems, for example, the Bluetooth system, the received signal needs to be level-adjusted prior to further processing. Furthermore, it is desirable to have a signal with a relatively constant strength (amplitude) to enable the full range of the processing circuits to be used. Moreover, the correct operation of analogue-to-digital converters can only be achieved if the excursion of the input signal is within the converter-specific dynamic range, thus avoiding saturation.

Automatic gain control circuits monitor the strength of the signal applied to the subsequent processing circuits, for example, an analogue-to-digital converter. A feedback signal is generated to readjust the gain of the amplifiers in the receiver stages, in a self-adaptive manner.

Conventionally, the feedback signal is typically generated by analogue circuitry. In systems where the signal is applied to an analogue-to-digital converter, if the level of the signal being applied to the analogue-to-digital converter exceeds the dynamic range of the analogue-to-digital converter, the control loop will have difficulty in reaching a steady state. This problem is particularly evident in applications where the received signal consists of packets of data with a short header code (preamble) during which time the automatic gain control circuitry needs to settle.

In the Bluetooth system, the short (4-bit) preamble allows only a very short settling time (4 microseconds) for the automatic gain control circuitry to settle prior to processing of the data packet. Traditional automatic gain control circuits in most modern receivers have difficulty achieving precise gain adjustment of the received signal to a desired level within such a short response time.

Thus, there is a need for an improved automatic gain control system and method having a faster response time than that available in conventional systems.

SUMMARY OF THE INVENTION

In general terms, the invention provides an automatic gain control system and method in which the output from a digital-to-analogue converter is used to generate the control signals to a number of variable gain control components. By monitoring the amplitude of the signal from the variable gain control components and performing an adjustment, the time required to place the amplitude of any signal within a much smaller window which is close to a reference level is reduced. Subsequently, fine gain adjustment may be performed. As a result, the time required to bring the input to the analogue-to-digital converter out of saturation is significantly reduced.

According to a first aspect there is provided an automatic gain control system comprising:
  at least one variable gain stage, the or each variable gain stage having an output, a signal input and a control input, said at least one variable gain stages being connectable in series;
  at least one sensor, the or each sensor having an input and an output, the input of the or each sensor being connectable to a respective output of said at least one variable gain stage;
  an analogue-to-digital converter having an input connectable to the output of one of said at least one variable gain stages, and an output;
  a control unit having an output and an input, the input of the control unit being connectable to the outputs of the sensors and to the output of the analogue-to-digital converter; and
  a digital-to-analogue converter having an input connectable to the output of the control unit, the digital-to-analogue converter further having at least one output, the control inputs of each of the at least one variable gain stages being connectable to an output of the digital-to-analogue converter, the outputs of the digital-to-analogue converter controlling the gain of the at least one variable gain stages.

According to a second aspect there is provided a burst-mode wireless communication system comprising the automatic gain control system defined above.

According to a third aspect there is provided a method for automatically controlling gain in a receiver system comprising:
  amplifying an incoming signal using at least one variable gain stageconnected in series, the at least one variable gain stages each having an output signal and a gain;
  comparing the output signal of each of the variable gain stages with a reference level using at least one sensor to determine if the output signal is greater than or less than the reference level, each of said at least one sensors having an output;
  if the output signal is greater than the reference level, setting the output of one or more of the at least one sensors;
  passing the output signal from one of the at least one variable gain stages to an analogue-to-digital converter to digitise the output signal to form a digitised signal;
  passing the digitised signal together with the output from one or more of the at least one sensors into a control logic unit to produce a digital signal; and
  converting said digital signal to at least one analogue signal to control the gains of one or more of the variable gain stages.

The systems and methods described herein are intended primarily for the application to burst first mode communication systems. However, they may also be easily implemented in a fully digital circuitry.

BRIEF DESCRIPTION OF THE DRAWINGS

Preferred embodiments of the invention will now be described by way of example and with reference to the accompanying drawings of which.

DETAILED DESCRIPTION OF PREFERRED EMBODIMENTS

Figure 1:
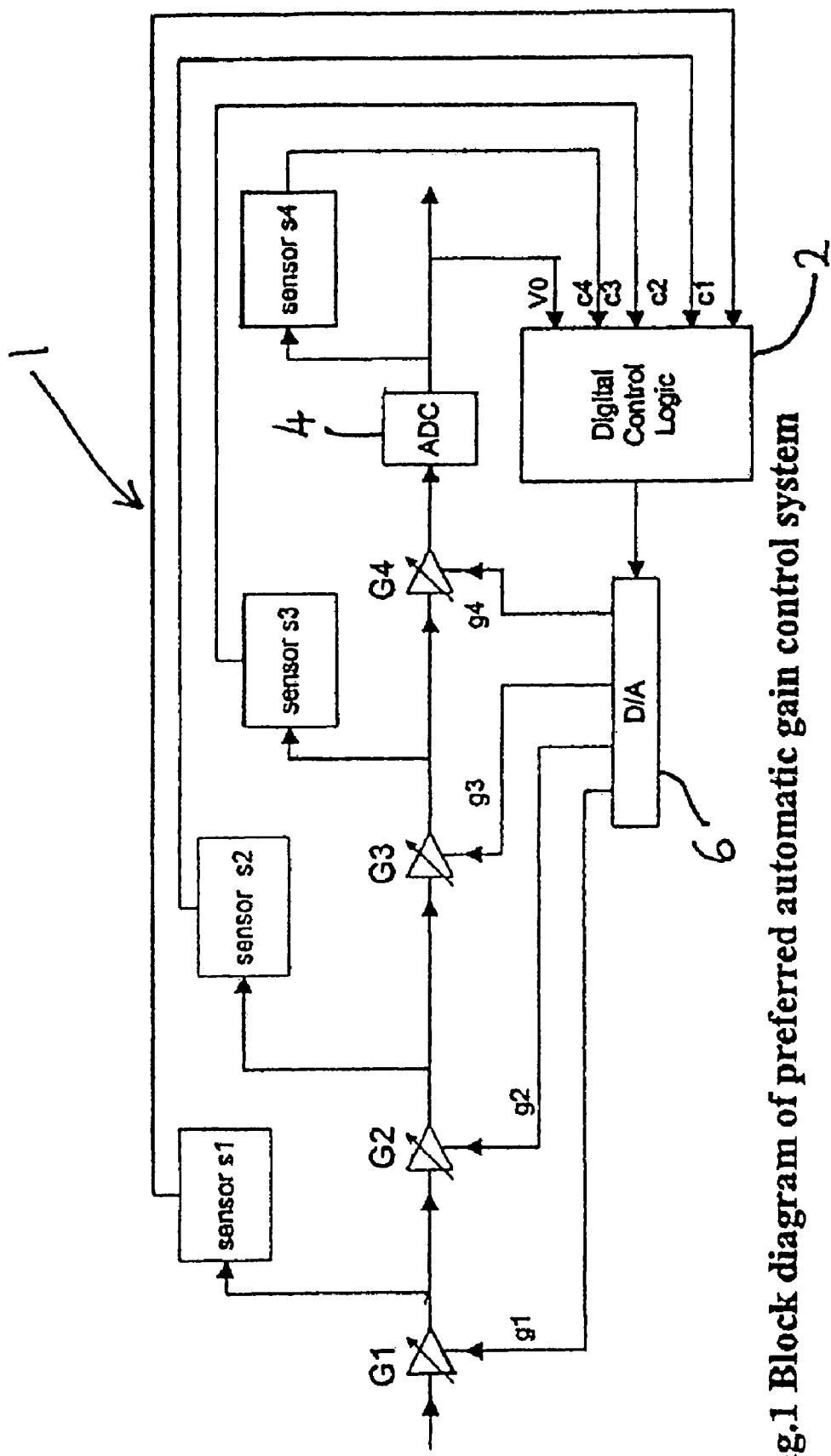
FIG. 1 is a schematic block diagram of an automatic gain control system according to a preferred embodiment.

FIG. 1 shows a block diagram of an automatic gain control system 1 according to a preferred embodiment of the invention. The automatic gain control system 1 comprises four variable gain control components G1, G2, G3 and G4, four sensors s1, s2, s3 and s4, a digital control logic unit 2, an analogue-to-digital converter 4, and a digital-to-analogue converter 6.

The four variable gain control components G1 to G4 are cascaded so that they are connected in series. The output of the variable gain control component G1 is taken to the input of the sensor s1, the output of the variable gain control component G2 is taken to the input of the sensor s2 and the output of the variable gain control component G3 is taken to the input of the sensor s3. The output of the variable gain control component G4 is connected to the input of the analogue-to-digital converter 4. The output of the analogue-to-digital converter 4 is connected to the sensor s4, to further processing circuitry (not shown) and, together with the outputs c1-c4 from the sensors s1 to s4, to the input of the digital control logic unit 2. The sensor s4 may alternatively be an analogue sensor connected to the output of G4.

The output of the digital control logic unit 2 is connected to the input of the digital-to-analogue converter 6. The outputs of the digital-to-analogue converter 6 are connected to the control inputs of the variable gain control components G1 to G4. The digital-to-analogue converter 6 provides control signals g1 to g4 to the variable gain control components G1 to G4 respectively.

The automatic gain control system 1, as shown in FIG. 1, generates a plurality of feedback signals to control the gain of the variable gain control components G1 to G4 based on the output of the analogue-to-digital converter 4 and the outputs c1 to c4 of the sensors s1 to s4.

The purpose of the automatic gain control system 1 is to adjust the scaling of the signal level applied to the analogue-to-digital converter 4 to ensure the full dynamic range of the analogue-to-digital converter 4 is used.

Sensor s1 monitors the amplitude of the signal at the output of the variable gain control component G1 in order to determine whether it is greater or smaller than the reference level Vref1. As shown in FIG. 1, if the output of G1 is greater than Vref1, c1=1 is generated at the output of the sensor s1. If the output of the variable gain control component G1 is less than Vref1, c1=0 is generated at the output of the sensor s1. The output c1 from the sensor s1, is applied to an input to the digital control logic unit 2.

Each of the sensors s1 to s4 illustrated in FIG. 1 performs an identical function, so the above description of the operation of sensor s1 is applicable to the other sensors s2 to s4. The respective outputs of the variable gain control components G2 to G4 are compared with the corresponding reference levels Vref2 to Vref4 respectively and the output signals c2 to c4 of the sensors s2 to s4 are generated respectively.

The choice of reference levels Vref1 to Vref4 used by the sensors s1 to s4 is dependent upon the application of the system in which the automatic gain control circuit 1 is to be used.

The main function of sensors s1 to s4 is to compare the signal amplitude with a reference level. Implementation can therefore be greatly simplified when the sensors s1 to s4 are fabricated in fully digital circuitry where an analogue filter is not required.

Figure 2:
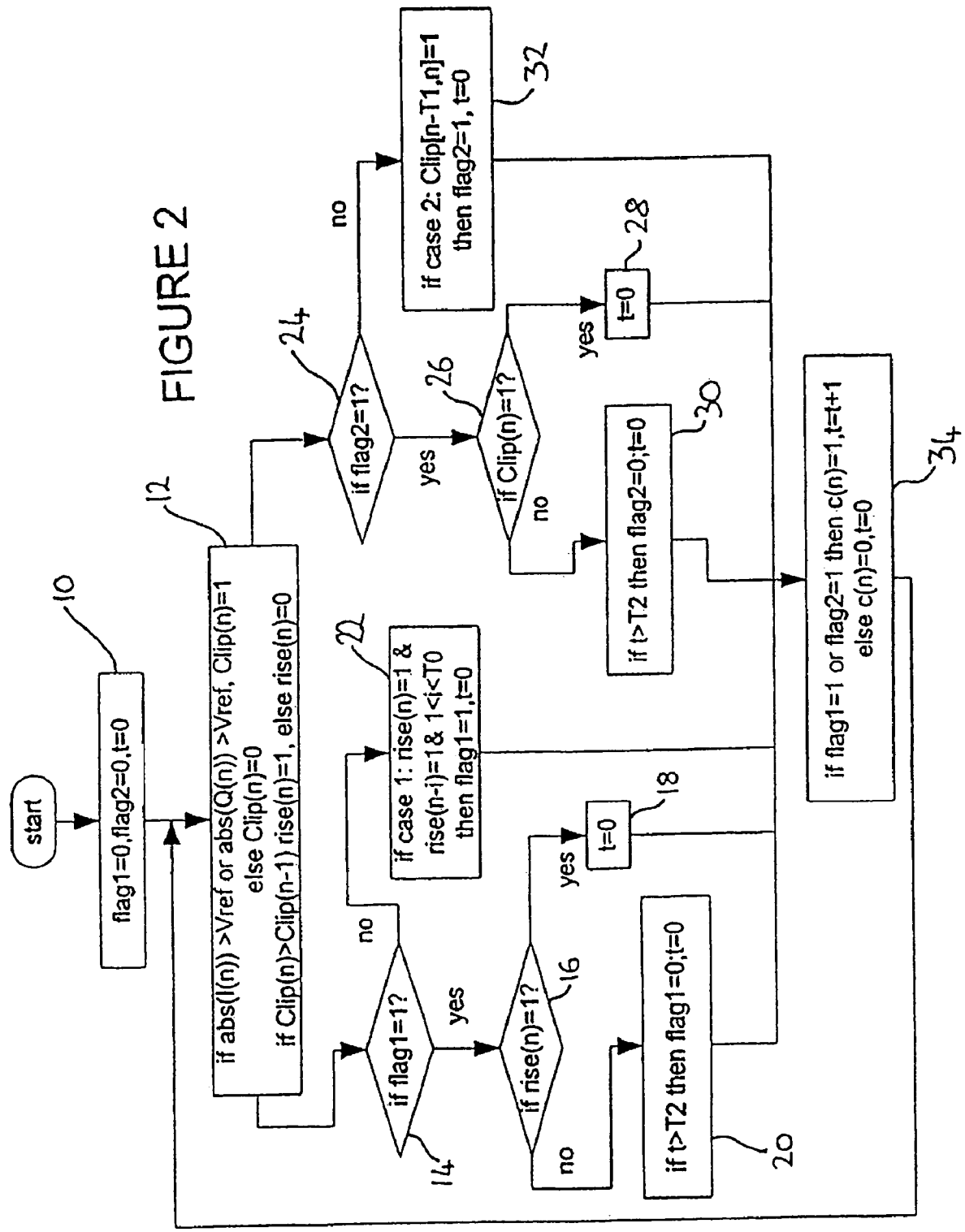
FIG. 2 is a flow chart of the operation of a sensor for use in the system of FIG. 1 when comparing a signal amplitude with a reference level.

An illustrative example of the operation of a digital implementation of the sensors shown in FIG. 1 is shown in FIG. 2.

The incoming signal, which may be comprised of an in-phase component I and a quadrature component Q, has an amplitude $\sqrt{I^2+Q^2}$. As it is difficult to determine the amplitude $\sqrt{I^2+Q^2}$, the in-phase and quadrature components are treated separately. The absolute values (abs(I) and abs(Q)) of the in-phase I and quadrature Q components are used. The absolute values of the in-phase I and quadrature Q components of the incoming signal are not a constant and they may sometimes be greater than the reference level and sometimes smaller than the reference level. However, the amplitude $\sqrt{I^2+Q^2}$ of the signal should be a constant.

To compare the amplitude (V) of the input signal to the sensor s1 with the predetermined reference level Vref, it is not generally sufficient to determine that the amplitude is greater than the reference level by observing only one sample of the signal, as this may be caused by noise, or the sample may be the maximum value of the signal. Two decision rules (case 1 and case 2) are proposed, therefore, to determine whether the amplitude of the signal is greater than or less than the reference level, with the two alternative rules (case 1 and case 2) being treated independently, as shown in FIG. 2 which illustrates the operation of a sensor for use in the automatic gain control system of FIG. 1 according to an embodiment of the invention.

In a first stage 10, as shown in FIG. 2, at the start of the cycle, the internal variables flag 1 and flag 2, and the time t as measured by a time counter are set to 0. Flag 1 and flag 2 are two-state variables which indicate whether or not the signal amplitude is greater than a reference level Vref based on the decision rules case 1 and case 2, respectively.

After the internal variables have been set to 0 in the first stage 10, in a second stage 12 a determination is made as to whether or not the absolute value of either of the in-phase or quadrature components is greater than a reference value, (that is, if either abs(I)>Vref or abs(Q)>Vref). If either of the in-phase or quadrature components is greater than a reference value, then internal variable Clip(n) becomes equal to 1. Clip(n) is a two-state variable which indicates whether or not the signal amplitude at an nth time instant is greater than a reference level Vref.

If the absolute value of neither of the in-phase or quadrature components is greater than a reference value, (that is, if both abs(I)<Vref and abs(Q)<Vref), the internal variable Clip(n) is 0.

If Clip(n) is greater than Clip(n−1), then the two-state internal variable rise(n) is set so that rise(n)=1. Rise(n)=1 indicates that clip(n) has changed state from 0 to 1 since the previous sample of the incoming signal. This indicates that an increase in the signal amplitude across the reference level Vref has occurred.

However, if Clip(n) is less than or equal to Clip(n−1), then rise(n)=0.

In the second stage 12, the incoming signal is examined according to both case rules 1 and 2.

Case 1

This rule is applied to the incoming signal as follows. The incoming signal is sampled at intervals $t_i$ for a period T0, during which time every sample of the incoming signal V (that is abs(I) and abs(Q)) is compared with Vref. If rise(n) is again recorded as being 1 during the period T0, flag 1 is set to 1 (that is to TRUE) for a period T2. If rise(n)=1 is not detected during the period T2, then flag 1 is reset to 0 after time T2.

However, if during the period T2, rise(n) is detected as being 1, then flag 1 is maintained at flag 1=1 for a further period T2 from this instant.

Similarly, if a further instance of rise(n)=1 occurs during the period T2, flag 1 will be extended by an additional period T2 from this instant, on each occasion.

Case 2

This rule is also applied to the incoming signal in the second stage 12. Initially, the incoming signal V is compared with Vref at intervals $t_i$ for a period T1. If every sample of V is greater than or equal to Vref during the period T1, that is Clip(n)=1, flag 2 is set to 1 for a period T2.

If, within the period T2, the sampled incoming signal V is greater than Vref, that is Clip(n)=1, then the sampling period is extended by a further period T2 from that instant and the signal is continuously sampled in this extended period.

If, within the period T2, a sample of the incoming signal V is not greater than Vref, that is Clip(n)=0, then flag 2 is reset to 0 at a time T2 from this instant.

As shown in FIG. 2, the two cases 1 and 2 are treated independently but preferably simultaneously.

For both cases, the samples are counted in the time counter (not shown) and the periods T0 to T2 are determined by the time counter.

For each sample of the incoming signal, flag 1 is examined in a third stage 14 to determine its state.

If flag 1 equals 1, in a fourth stage 16, a determination is made as to whether or not rise(n) equals 1. If rise(n) equals 1, then t is reset to 0 in a fifth stage 18 to restart the period T0. However, if rise(n) equals 0, and T2 has expired, then flag 1 is set to 0 in a sixth stage 20 and t is reset to 0.

If, in the third stage 14, it is determined that flag 1=0, and rise(n)=1 for a second time during the period T0, then, in a further stage 22, flag 1 is set to 1 and t is set to 0.

As shown in FIG. 2 with regard to case 2, in an alternative third stage 24, a determination is made as to whether or not the variable flag 2 equals 1. If flag 2 equals 1, in an alternative fourth stage 26, a determination is made as to whether or not Clip(n) equals 1. If Clip(n) equals 1, then t is reset to 0 in a further stage 28 to maintain flag 2 equal to 1 for a period T2 from this instant.

However, if Clip(n) equals 0, and T2 has expired, then flag 2 is set to 0 in a further stage 30 and t is reset to 0.

If, in the alternative third stage 24, it is determined that flag 2 equals 0 and if Clip(n) has been equal to 1 for the period T1, then in a further stage 32 flag 2 is set to 1 and the time t is reset to 0.

In a final stage 34, if it is determined that flag 1 equals 1 or flag 2 equals 1, then this sets the output of the sensor illustrated in FIG. 2 to 1 and the time counter is incremented so that t=t+1. The output of the sensors is denoted as c(n). For example, for sensor s1, the output variable is defined as c1 in FIG. 1, which is an input variable to the Digital Control Logic Unit 2 of the system of FIG. 1.

The above procedure is then repeated for the next sample.

However, if neither flag 1 nor flag 2 equals 1, the output of this sensor is set to 0 and the time counter is reset so that t equals 0.

T0, T1 and T2 are positive constants which are determined according to the application.

Figure 3:
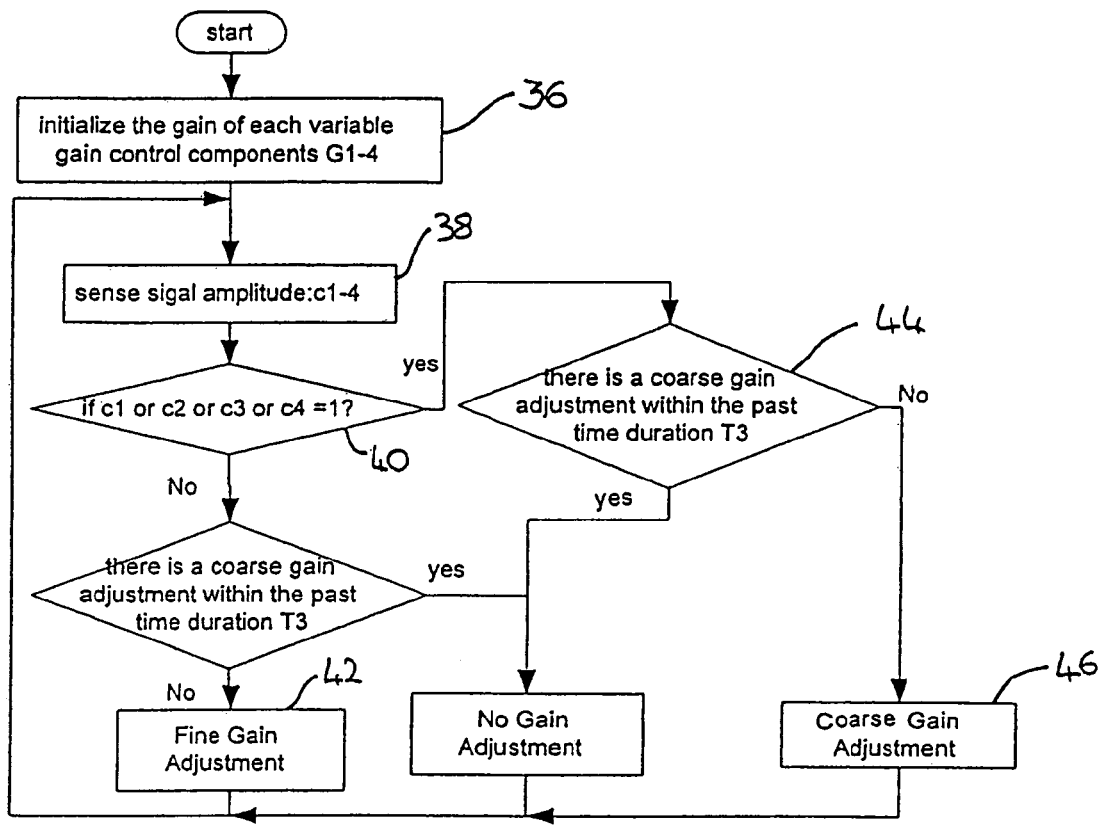
FIG. 3 is a flow chart of the operation of an automatic gain control system according to a preferred embodiment.

The operation of the digital control logic unit 2 is illustrated by the flow chart shown in FIG. 3. The digital control logic unit 2 controls the variable gain control components G1 to G4 in response to the outputs c1 to c4 of the sensors s1 to s4 and the sample of the analogue-to-digital converter 4 output. The control exerted by the digital control logic unit 2 is in two stages, namely, coarse gain control and fine gain control.

FIG. 3 shows the procedure of the automatic gain control operation as comprising the following steps:

1. At a starting time, in a first step 36 the gain of the variable gain control components G1 to G4 is set to a non-zero intermediate value. The advantage of a non-zero setting is that when the received signal is very weak, the automatic gain control system can reach the steady state more quickly than automatic gain control systems initialised with a zero value.

2. In a second step 38, the amplitudes of the outputs c1 to c4 of the sensors s1 to s4 are sensed. The sensors s1 to s4 compare the amplitude of the output of the variable gain control components G1 to G4 with the predefined reference level Vref.

3. In a third step 40, a determination is made as to whether or not any of the outputs from sensors s1 to s4 are TRUE, that is whether any of c1 to c4 equals 1. If none of the outputs from sensors s1 to s4 is "TRUE" and a coarse gain adjustment has been made within the first time duration T3, then no fine gain adjustment will be made. If none of the outputs from sensors s1 to s4 is "TRUE" and there is no coarse gain adjustment within the pass time duration T3, a fine gain adjustment is performed in a fourth step 42 in response to the samples collected at the analogue-to-digital converter 4 output, according to the following equation:

$$g_n = g_{n-1} + (\log_{10} V_{ref} - \log_{10} abs(v_{on}))b \qquad (1)$$

where:

$g_n$ is the adjusted gain, that is, the gain at time instant n $g_{n-1}$ is the gain at time instant n−1

$v_{on}$ is the output of the analogue-to-digital converter 4 at time instant n $abs(v_{on})$ is the absolute value of the output from the analogue-to-digital converter 4 at time instant n;

Vref is the reference amplitude; and b is a constant.

The most recent gain of each gain control component G1 to G4 is updated based on the latest value of $g_n$.

The operation given by equation (1) is an example only. Other known prior art operations may be applied to the present invention.

After the fine gain adjustment has been performed, the outputs c1 to c4 of the sensors s1 to s4 are resampled and the process repeated.

4. If any output of the sensors s1 to s4 is "TRUE" a determination is made in a further step 44 as to whether or not a coarse gain adjustment has been detected within the past time duration T3. If no coarse gain adjustment has been detected, a coarse gain adjustment is performed in a further step 46. After the coarse gain adjustment has been performed, the outputs c1 to c4 of the sensors s1 to s4 are resampled and the process repeated.

If a coarse gain adjustment has been detected in the further stage 44, then no gain adjustment is made and the outputs c1 to c4 of the sensors s1 to s4 are resampled and the process repeated. The rules of operation of a coarse gain adjustment are illustrated in the example given below:

(a) if c1=1, the gain of G2–G4 is set to 0 dB (g2–4=0), the gain g1 of G1 is reduced by 6 dB(g1=g1–6)
(b) if c2=1, the gain of G3–G4 is set to 0 dB (g3–4=0), the gain of G2 is reduced by 6 dB (g2=g2–6)
(c) if c3=1, the gain of G4 is set to 0 dB (g4=0), the gain of G3 is reduced by 6 dB (g3=g3–6)
(d) if c4=1, the gain of G4 is reduced by 6 dB (g4=g4–6).

By monitoring the amplitude of the signal from the variable gain control components G1 to G4 and performing the coarse gain adjustment, the time required to place the amplitude of any signal within a much smaller window which is close to the reference level Vref is reduced. Subsequently, the fine gain adjustment may be performed. As a result, the time required to bring the input to the analogue-to-digital converter 4 out of saturation is significantly reduced.

The digital-to-analogue converter 6 is then used to generate the control signals to the variable gain control components G1 to G4.

In summary, preferred embodiments of the automatic gain control system and method for implementing the automatic gain control system of the present invention are considerably advantageous over known techniques. For example, embodiments of the present invention may be implemented with fully integrated digital circuitry and simple, robust and inexpensive sensors may be used. Also, one or more preferred embodiments of the invention permit a faster settling time for the automatic gain control based on the monitoring of the amplitude of the received signal than is possible in conventional systems.

It will be appreciated that the scope of the present invention is not restricted to the described embodiments. For example, whilst the embodiments have been described in terms of four sensors and four variable gain control components, a different number of such components may be used. Numerous other modifications, changes, variations, substitutions and equivalents will therefore occur to those skilled in the art without departing from the spirit and scope of the present invention.

The invention claimed is:

1. An automatic gain control system comprising:
   at least one variable gain stage, the or each variable gain stage having an output, a signal input and a control input, said at least one variable gain stages being connectable in series;
   at least one sensor, the or each sensor having an input and an output, the input of the or each sensor being connectable to a respective output of said at least one variable gain stage;
   an analogue-to-digital converter having an input connectable to the output of one of said at least one variable gain stages, and an output;
   a control unit having an output and an input, the input of the control unit being connectable to the outputs of the sensors and to the output of the analogue-to-digital converter; and
   a digital-to-analogue converter having an input connectable to the output of the control unit, the digital-to-analogue converter further having at least one output, the control inputs of each of the at least one variable gain stages being connectable to an output of the digital-to-analogue converter, the outputs of the digital-to-analogue converter controlling the gain of the at least one variable gain stages.

2. The automatic gain control system of claim 1, comprising N variable gain stages and N sensors, where N is an integer of two or more.

3. The automatic gain control system of claim 1, wherein said at least one sensor are arranged to determine if the output from the at least one variable gain stages is greater than a predetermined reference level.

4. The automatic gain control system of claim 1, wherein said at least one sensor are arranged such that the output of one or more of the at least one sensor is set if the output from the one or more variable gain stages is greater than a predetermined reference level.

5. The automatic gain control system of claim 1, wherein said control unit is a digital control logic unit.

6. The automatic gain control system of claim 1, wherein each of said variable gain stages has a gain associated therewith, said control unit being arranged to control the gain of each of said at least one variable gain stages.

7. The automatic gain control system of claim 6, wherein said control unit is arranged to control the gain of each of said at least one variable gain stages using coarse and/or fine gain control.

8. A burst-mode wireless communication system comprising the automatic gain control system of claim 1.

9. A method for automatically controlling gain in a receiver system comprising:
   amplifying an incoming signal using at least one variable gain stage connected in series, the at least one variable gain stages each having an output signal and a gain;
   comparing the output signal of each of the variable gain stages with a reference level using at least one sensor to determine if the output signal is greater than or less than the reference level, each of said at least one sensors having an output;
   if the output signal is greater than the reference level, setting the output of one or more of the at least one sensors;
   passing the output signal from one of the at least one variable gain stages to an analogue-to-digital converter to digitise the output signal to form a digitised signal;
   passing the digitised signal together with the output from one or more of the at least one sensors into a control logic unit to produce a digital signal; and
   converting said digital signal to at least one analogue signal to control the gain of one or more of the variable gain stages.

10. The method of claim 9, further comprising setting initially the gain of one or more of the at least one variable gain control stages to a non-zero value.

11. The method of claim 9, further comprising setting initially the gain of each of the at least one variable gain control stages to a non-zero value.

12. The method of claim 9, further comprising sampling the incoming signal at regular intervals for a first predetermined time period, and extending the first predetermined time period for a second predetermined time period if the incoming signal is greater than the reference level within the first predetermined time period.

13. The method of claim 12, further comprising restarting the second predetermined time period if, during said second predetermined time period, the incoming signal being sampled exceeds the reference level.

14. The method of claim 12, further comprising producing a signal to be passed to the input of the control unit when the output of one or more of the at least one sensors indicates that the incoming signal being sampled exceeds the reference level during the first predetermined time period.

15. The method of claim 12, wherein if after sampling the input signals the output of any of the sensors is set, the method further comprises:

reducing by a predetermined amount the gain of the variable gain stage corresponding to the sensor whose output has been set using said control logic unit, said predetermined amount corresponding to a coarse gain jump;

setting to around zero dB the gain of the variable gain stages subsequent to the variable gain stage whose gain has been reduced; and resampling said incoming signal.

16. The method of claim 15 wherein the step of reducing the gain of the variable gain stage comprises reducing the gain by around 6 dB.

17. The method of claim 12, further comprising making a fine adjustment to the gain of one or more of the variable gain stages if none of the outputs of the at least one sensors is set, said fine adjustment being determined from the digitised signal output from the analogue-to-digital converter.

18. The method of claim 17, wherein the step of making a fine gain adjustment comprises adjusting the gain of one or more of the variable gain stages according to the equation:

$$g_n = g_{n-1} + (\log_{10} V_{ref} - \log_{10} abs(v_{on}))b$$

in which $g_n$ is the adjusted gain at time instant n, $g_{n-1}$ is the gain at time instant n−1, $abs(v_{on})$ is the absolute value of the output from the analogue-to-digital converter at time instant n, Vref is the reference amplitude, and b is a constant.

* * * * *